United States Patent [19]

Imai

[11] Patent Number: 5,424,228
[45] Date of Patent: Jun. 13, 1995

[54] METHOD FOR FABRICATING A BIPOLAR TRANSISTOR WITH REDUCED BASE RESISTANCE

[75] Inventor: Kiyotaka Imai, Tokyo, Japan

[73] Assignee: NEC Corporation, Tokyo, Japan

[21] Appl. No.: 258,999

[22] Filed: Jun. 13, 1994

Related U.S. Application Data

[62] Division of Ser. No. 978,741, Nov. 19, 1992.

[30] Foreign Application Priority Data

Nov. 20, 1991 [JP] Japan .................. 3-304296

[51] Int. Cl.⁶ .................. H01L 21/265; H01L 21/20
[52] U.S. Cl. .................. 437/31; 437/89; 437/90
[58] Field of Search .................. 437/31, 89, 90; 257/587, 592

[56] References Cited

U.S. PATENT DOCUMENTS

| 4,675,983 | 6/1987 | Uehara | 257/592 |
| 4,710,241 | 12/1987 | Komatsu | |
| 4,729,965 | 3/1988 | Tamaki et al. | |
| 4,740,482 | 4/1988 | Hirao | |
| 5,006,912 | 4/1991 | Smith et al. | |
| 5,296,391 | 3/1994 | Sato et al. | 437/31 |
| 5,302,535 | 4/1994 | Imai et al. | 257/592 |
| 5,321,301 | 6/1994 | Sato et al. | 257/587 |
| 5,323,032 | 6/1994 | Sato et al. | 257/592 |
| 5,340,751 | 8/1994 | Maeda et al. | 437/31 |
| 5,356,821 | 10/1994 | Naruse et al. | 437/31 |

OTHER PUBLICATIONS

E. Ganin et al., "Epitaxial-Base Double"Poly Self-Aligned Bipolar Transistors", *1990 IEEE* IEDM-90, pp. 603-606.

F. Sato et al., "Self-Aligned Selective MBE Technology for High-Performance Bipolar Transistors", *1990 IEEE*, IEDM-90, pp. 607-610.

Primary Examiner—Olik Chaudhuri
Assistant Examiner—Brian K. Dutton
Attorney, Agent, or Firm—Burns, Doane, Swecker & Mathis

[57] ABSTRACT

A semiconductor device manufacturing method according to the present invention includes forming an outer base region in a collector layer. The outer base region connects an intrinsic base layer and a base electrode so that base contact resistance between them is decreased.

7 Claims, 9 Drawing Sheets

METHOD FOR FABRICATING A BIPOLAR TRANSISTOR WITH REDUCED BASE RESISTANCE

This application is a divisional of application Ser. No. 07/978,741, filed Nov. 19, 1992.

FIELD OF THE INVENTION

This invention relates to semiconductor device, and more particularly to, a self-aligned bipolar transistor and a method for fabricating the same.

BACKGROUND OF THE INVENTION

In the fabrication of a self-aligned bipolar transistor, it is necessary to decrease a thickness of the base layer in order to realize a high frequency operation and to provide a sufficient break-down voltage. If a base layer is formed by ion implantation method, the problems such as channeling, quality-scattering due to low energy, implanation damage, etc. occur. Therefore, it is difficult to realize a self-aligned bipolar transistor having a thin base layer, if an ion implantation method is used to form the base layer.

Recently, a self-aligned bipolar transistor in which a base layer is formed by epitaxial technology has been proposed. According to epitaxial technology, it is possible to control a thickness and an impurity concentration of a base layer precisely.

A first conventional self-aligned bipolar transistor, which is described on pages 603 to 606 in a report "IEDM 90", includes a P− silicon substrate, an N+ epitaxial layer for a collector formed on the substrate, a P+ polycrystal silicon layer for a base electrode, which is formed on the N+ epitaxial layer and is provided with an aperture therein, a P-epitaxial base layer formed on the N+ epitaxial layer at the bottom of the aperture, a P-polycrystal silicon layer which is grown on an inner side surface of the aperture, an insulation layer formed on a surface of the P+ polycrystal silicon layer, a sidewall oxide layer formed on the inner side surface of the aperture which is covered with the P-polycrystal silicon layer, an N+ polycrystal silicon layer for an emitter electrode, which is formed in the aperture, and an N+ emitter layer formed on the P-epitaxial base layer by an impurity diffusion from the N+ polycrystal silicon layer. The aperture of the P+ polycrystal silicon layer is formed by dry-etching.

According to the first conventional self-aligned bipolar transistor, however, there are disadvantages in that the silicon substrate and the N+ epitaxial layer are damaged by the dry-etching process for forming the aperture. Further, a short circuit may result between the N+ polycrystal silicon layer and P+ polycrystal silicon layer, that is, between the base and emitter electrodes, because the sidewall oxide layer has a thin portion thereof at the corner of the P-polycrystal silicon layer.

A second conventional self-aligned bipolar transistor, by which the above disadvantges of the first conventional self-aligned bipolar transistor are overcome, is described on pages 607 to 610 in a report "IEDM 90".

The bipolar transistor includes a P− silicon substrate, an N+ epitaxial layer for a collector, an insulation oxide layer formed on the N+ epitaxial layer, a P+ polycrystal silicon layer for a base electrode, which is formed on the oxide layer and is provided with an aperture therein, a P-epitaxial base layer formed on the N+ epitaxial layer in the aperture by a selective growth, a P-polycrystal silicon layer which is grown on an inner side surface of the aperture at the same time the P-epitaxial base layer is grown for connecting the P-epitaxial base layer to the P+ polycrystal silicon layer, a sidewall insulation layer formed on the inner side surface of the aperture, an N+ polycrystal silicon layer for an emitter electrode, which is formed in the aperture covered with the sidewall layer, and an N+ emitter layer formed on a surface of the P-epitaxial base layer by an impurity diffusion from the N+ polycrystal silicon layer.

In the second conventional self-aligned bipolar transistor, the oxide layer is formed between the N+ epitaxial layer and the P+ polycrystal silicon layer. Therefore, when the aperture is formed in the P+ polycrystal silicon layer, the dry-etching process is carried out at the surface of the oxide layer. As a result, the silicon substrate and the N+ epitaxial layer are not damaged by the dry-etching process.

However, there is a disadvantage in that the contact area between the P+ polycrystal silicon layer and the P-epitaxial base layer is relatively small, so that a base contact resistance between them is increased if the P-polycrystal layer is not grown sufficiently.

SUMMARY OF THE INVENTION

Accordingly, it is an object of the invention to provide a semiconductor device having a low base contact resistance.

It is a further object of the invention to provide a method for fabricating a semiconductor having a low base contact resistance.

According to the first feature of the invention, a semiconductor device, includes: a substrate of a first conductivity type; a collector layer formed on the substrate, the collector layer being of a second conductivity type which is opposite to the first conductivity type; a base electrode layer of the first conductivity type, which is formed on the collector layer and has an aperture thereon; an intrinsic base layer of the first conductivity type, which is formed on the collector layer in the aperture; a connection layer formed between the base electrode layer and the intrinsic base layer for connecting them each other; an emitter electrode layer of the second conductivity type, which is formed in the aperture to be connected to the intrinsic base layer; an emitter layer of the second conductivity type, which is formed in the aperture to be connected to the emitter electrode and to the intrinsic base layer, respectively; a sidewall layer formed on an inner side surface of the aperture for insulating between the base electrode layer and the emitter electrode layer; and an outer base region of the first conductivity type, which is formed in the collector layer for connecting the intrinsic base layer and the base electrode layer.

According to the second feature of the invention, a method for fabricating a semiconductor device, includes the steps of: providing a silicon substrate of a first conductivity type on which a collector layer of a second conductive type which is opposite to the first conductivity type is formed; forming an insulation layer on the collector layer at a portion where an intrinsic base layer will be formed; forming a base electrode layer of the first conductivity type on the collector layer; forming an aperture on the base electrode layer by etching using the insulation layer as a stopper; forming a sidewall insulation layer on an inner side surface of the aperture; forming an outer base region of the first conductivity type in the collector layer to connect the intrinsic base layer to the base electrode layer; forming the intrinsic base layer of the first conductivity type on the collector layer in the aperture; forming an emitter electrode layer of the second conductivity type in the aperture to be connected to the intrinsic base layer; and forming an emitter layer of the second conductivity type in the aperture to be connected to the emitter electrode layer and to the intrinsic base layer, respectively.

In the feature, preferably, the outer base region is formed by diffusing impurities from the base electrode layer into the collector layer, the intrinsic base layer is formed by using molecular beam epitaxy (MBE) selective growing method.

The other objects and features of this invention will become understood from the following description with reference to the accompanying drawings.

DESCRIPTION OF THE PREFERRED EMBODIMENTS

For better understanding the background of the present invention, the basic principle of the conventional technology is first described hereinafter with reference to FIGS. 1 and 2.

Figure 1:
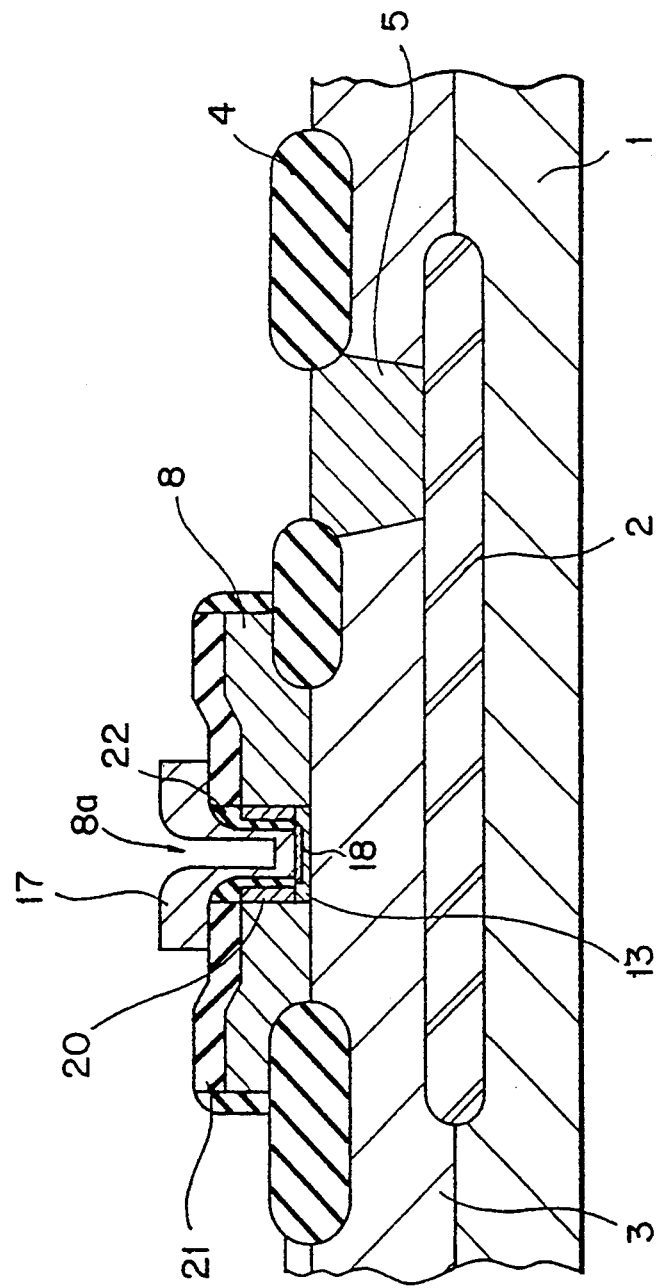
FIG. 1 is a cross-sectional view illustrating a first conventional semiconductor device.

FIG. 1 shows a first conventional self-aligned bipolar transistor. The self-aligned bipolar transistor includes a P− silicon substrate 1, an N+ buried layer 2, an N+ epitaxial layer 3 formed on the P− silicon substrate 1 and the N+ buried layer 2, a field oxide layer 4 formed on the N+ epitaxial layer 3 as a device separator, an N+ collector outgoing layer 5 formed on the buried layer 2, a P+ polycrystal silicon layer 8 for a base electrode, which is formed on the N+ epitaxial layer 3 and is provided with an aperture 8a therein, a P-epitaxial base layer 13 formed on the N+ epitaxial layer 3 at the bottom of the aperture 8a by a low temperature epitaxial method, a P-polycrystal silicon layer 20 which is grown on an inner side surface of the aperture 8a at the same time when the P-epitaxial base layer 13 is grown, an insulation layer 21 formed on a surface of the P+ polycrystal silicon layer 8, a sidewall oxide layer 22 formed on the inner side surface of the aperture 8a covered with the P-polycrystal silicon layer 20, an N+ polycrystal silicon layer 17 for an emitter electrode, which is formed in the aperture 8a, and an N+ emitter layer 18 formed on the P-epitaxial base layer 13 by an impurity diffusion from the N+ polycrystal silicon layer 17. The aperture 8a of the P+ polycrystal silicon layer 8 is formed by dry-etching.

According to the first conventional self-aligned bipolar transistor, however, there are disadvantages, as formerly described, in that the silicon substrate 1 and the epitaxial layer 3 are damaged by the dry-etching process for forming the aperture 8a, for example, a depression is formed on the substrate 1. Further, a short circuit may be provided between the P+ polycrystal silicon layer 8 and N+ polycrystal silicon layer 17, that is, between the base and emitter electrodes, because the sidewall oxide layer 22 has a thin portion thereof at the corner of the P-polycrystal silicon layer 20.

Figure 2:
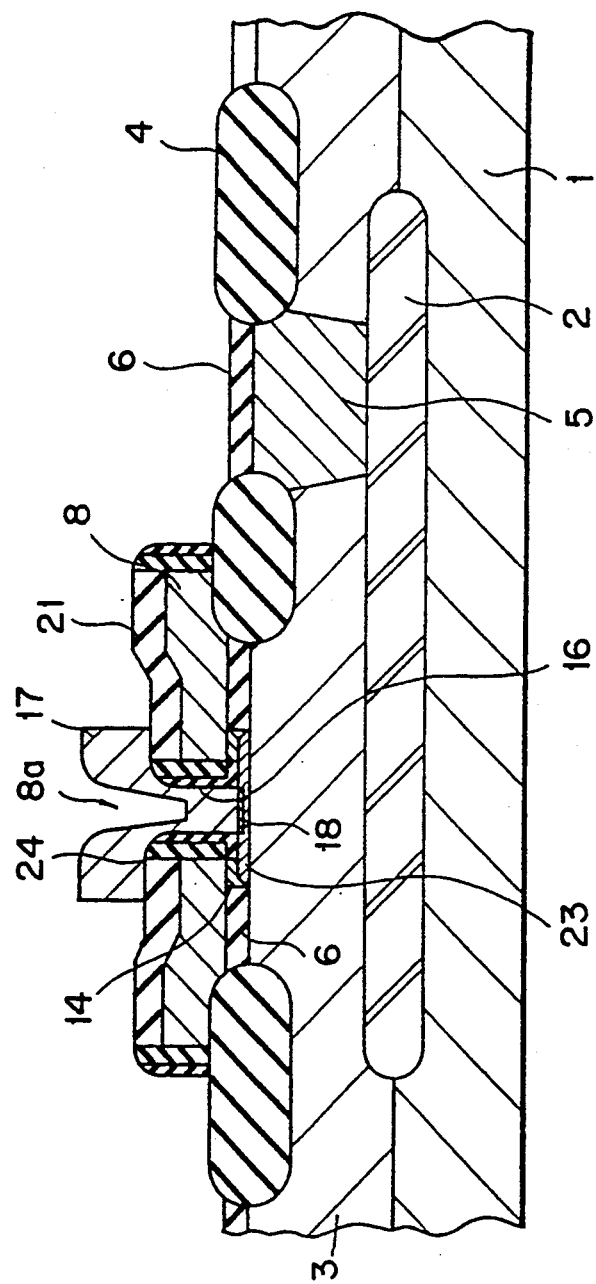
FIG. 2 is a cross-sectional view illustrating a second conventional semiconductor device.

FIG. 2 shows a second conventional self-aligned bipolar transistor. In the explanation of the second conventional bipolar transistor, the structure corresponding to the second conventional semiconductor device will be just briefly explained.

The second conventional self-aligned bipolar transistor includes a P− silicon substrate 1, an N+ buried layer 2, an N+ epitaxial layer 3, a field oxide layer 4, an N+ collector outgoing layer 5, an insulation oxide layer 6 formed on the N+ epitaxial layer 3, a P+ polycrystal silicon layer 8 for a base electrode, which is formed on the oxide layer 6 and is provided with an aperture 8a therein, a P-epitaxial base layer 23 formed on the N+ epitaxial layer 3 in the aperture 8a by a selective growth, a P-polycrystal silicon layer 14 which is grown on an inner side surface of the aperture 8a at the same time when the P-epitaxial base layer 23 is grown for connecting the P-epitaxial base layer 23 to the P+ polycrystal silicon layer 8, an insulation layer 21 formed on the P+ polycrystal silicon layer 8, sidewall oxide layers 16 and 24 formed on the inner side surface of the aperture 8a, an N+ polycrystal silicon layer 17 for an emitter electrode, which is formed in the aperture 8a covered with the sidewall oxide layers 16 and 24, and an N+ emitter layer 18 formed on a surface of the P-epitaxial base layer 23 by an impurity diffusion from the N+ polycrystal silicon layer 17.

According to the second conventional self-aligned bipolar transistor, the silicon substrate 1 and the epitaxial layer 3 have no damage by the dry-etching process for forming the aperture 8a like the first conventional bipolar transistor shown in FIG. 1, because the dry-etching process is carried out at the surface of the insulation oxide layer 6.

However, there is a disadvantage, as also formerly described, in that the contact area between the P+ polycrystal silicon layer 8 and the P-epitaxial base layer 23 is small, so that a base contact resistance between them is increased if the P-polycrystal layer 14 is not grown sufficiently.

Figure 3:
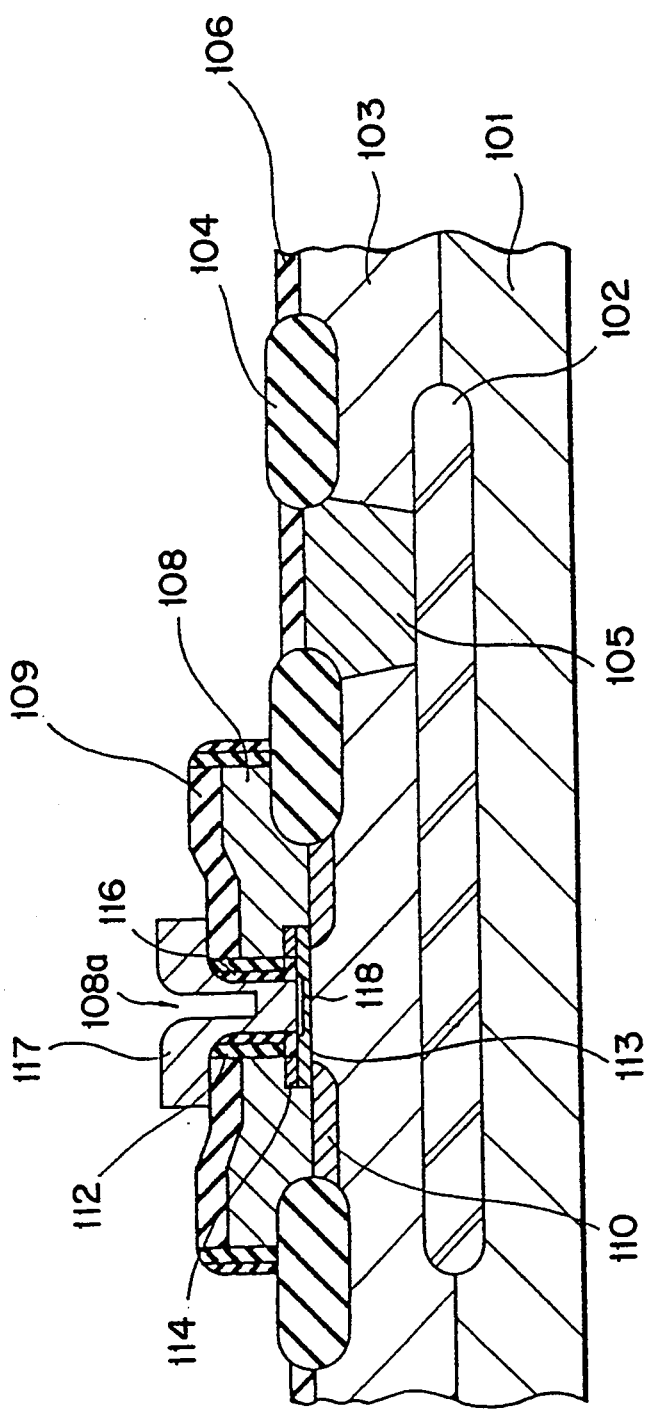
FIG. 3 is a cross-sectional view illustrating a semiconductor device of a first preferred embodiment according to the invention.

FIG. 3 shows a self-aligned bipolar transistor of a first preferred embodiment according to the invention. The self-aligned bipolar transistor includes a P− silicon substrate 101 having a resistivity of approximately 1 Ω.cm, an N+ buried layer 102 formed by ion implantation, an N− epitaxial layer 103 having a concentration of $5 \times 10^{15}$ to $1 \times 10^{16}$ cm$^{-3}$ and a thickness of 1.0 to 1.8 μm, which is formed on the P− silicon substrate 101 and the N+ buried layer 102, a field oxide layer 104 formed on the N− epitaxial layer 103 for separating the layers from each other, an N+ collector outgoing layer 105 formed on the buried layer 102 between the field oxide layers 104, a P+ polycrystal silicon layer 108 for a base electrode, which is formed on the N− epitaxial layer 103 and is provided with an aperture 108a therein, a P-intrinsic epitaxial base layer 113 having a concentration of $1 \times 10^{18}$ to $2 \times 10^{19}$ cm$^{-3}$ and a thickness of 20 to 70 nm, which is formed on the N− epitaxial layer 103 in the aperture 108a, a P-polycrystal silicon layer 114 formed on the P-intrinsic epitaxial base layer 113 for connecting the P-intrinsic epitaxial base layer 113 to the P+ polycrystal silicon layer 108, a P+ outer base region 110 formed at a surface of the N− epitaxial layer 103, through which the the P-intrinsic epitaxial base layer 113 is connected to the P+ polycrystal silicon layer 108, a nitride layer 109 formed on the P+ polycrystal silicon layer 108, a sidewall nitride layer 112 formed on an inner side surface of the aperture 108a, a sidewall oxide layer 116 formed on the surface of the sidewall nitride layer 112, an N+ polycrystal silicon layer 117 for an emitter electrode, which is formed in the aperture 108a covered with the sidewall layers 112 and 116, and an N+ emitter layer 118 formed at a surface of the P-intrinsic epitaxial base layer 113 by an impurity diffusion from the N+ polycrystal silicon layer 117.

Next, fabrication steps of the first preferred embodiment will be explained in conjunction with FIGS. 4A to 4H.

Figure 4A:
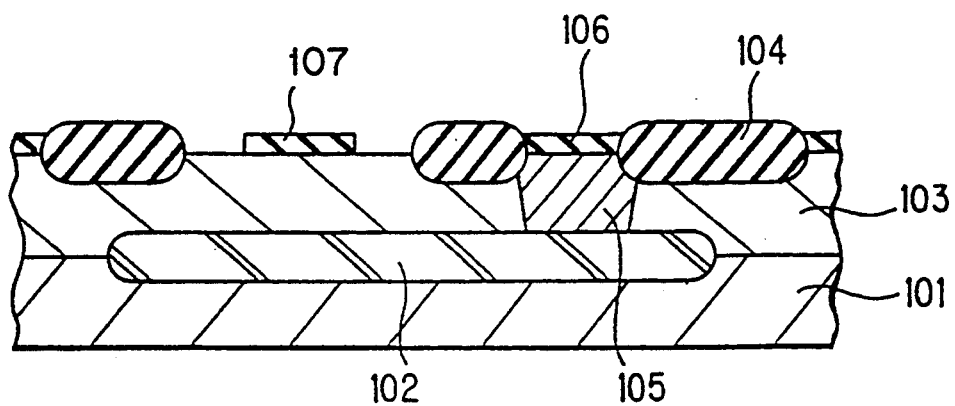
FIG. 4A to 4H are cross-sectional views illustrating steps for fabricating the semiconductor device of the first preferred embodiment, respectively.

First, a structure, which is composed of the P− silicon substrate 101, the N+ buried layer 102, the N− epitaxial layer 103, the N+ collector outgoing layer 105, and the field oxide layer 104, is provided. Then, the oxide layer 106 having a thickness of 40 to 140 nm is formed on the surface of the structure, and the oxide layer 106 is etched by photo-etching so that a stopper oxide layer 107 is left on the N− epitaxial layer 103 at a position where the base layer 113 will be formed, as shown in FIG. 4A.

Figure 4B:
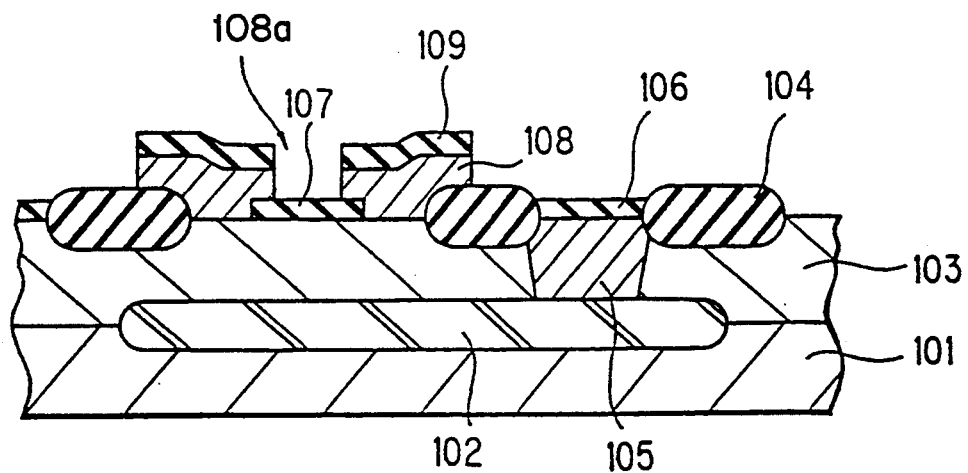

Second, the P+ polycrystal silicon layer 108 and the nitride layer 109 are grown on the precedently processed substrate in that order. Then, photo-resist is formed on the nitride layer 109 and the nitride layer 109 and the P+ polycrystal silicon layer 108 are dry-etched by using the stopper oxide layer 107 as a stopper to provide a pattern having an aperture 108a above the stopper oxide layer 107 as shown in FIG. 4B. In this process, the N− epitaxial layer 103 is protected by the stopper oxide layer 107, so that the epitaxial layer 103 has no damage by the etching process.

Figure 4C:
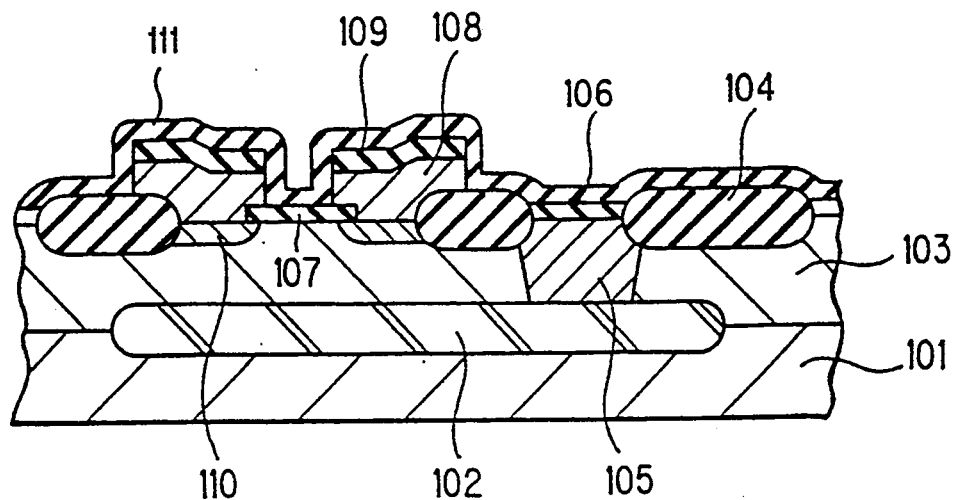

Third, the nitride layer 111 having a thickness of 100 to 200 nm is formed on the surface of the precedently processed substrate, and impurities are diffused from the P+ polycrystal silicon layer 108 into the P+ outer base region 110 in the epitaxial layer 103, as shown in FIG. 4C. According to an impurity diffusion method, the outer base region 110 can be formed to have a shallower depth as compared to ion implantation method.

Figure 4D:
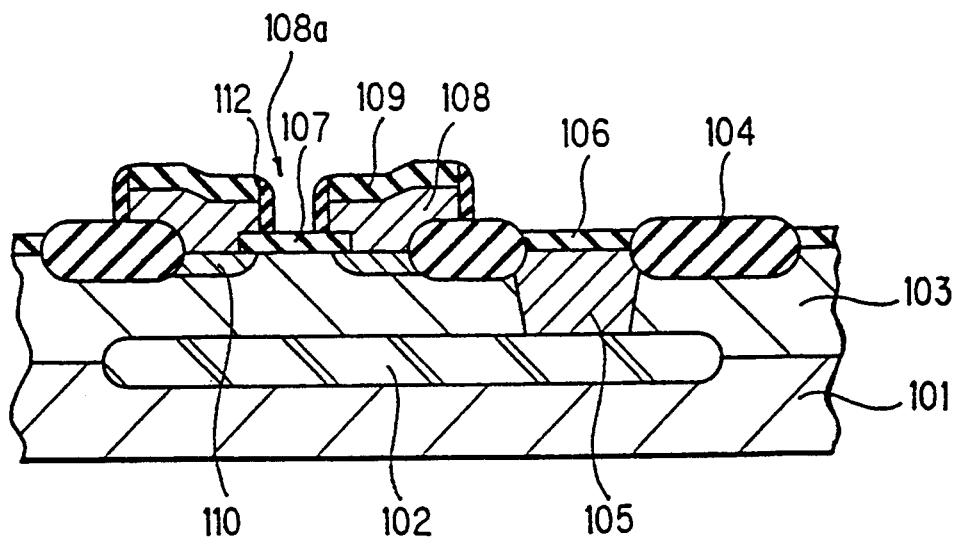

Fourth, the nitride layer 111 is etched by anisotropic dry etching using the stopper oxide layer 107 as a stopper to form the sidewall nitride layer 112 on the inner side surface of the aperture 108a as shown in FIG. 4D. At this time, in the same manner as the process forming the aperture 108a, the epitaxial layer 103 has no damage by the etching.

Figure 4E:
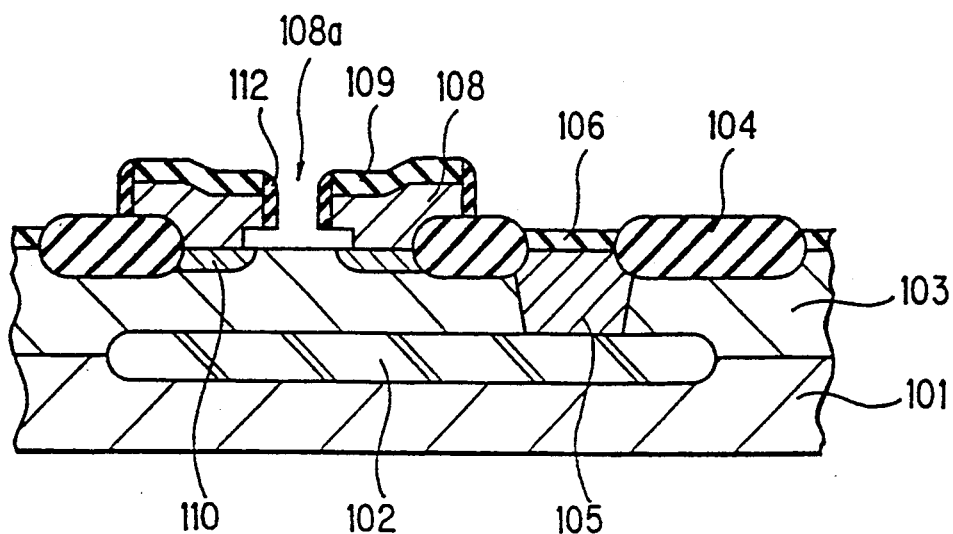

Fifth, the stopper oxide layer 107 is wet-etched to form a depression having a height of 40 to 140 nm and a side depth of 0.1 to 0.4 μm at the bottom of the aperture 108a into the P+ polycrystal silicon layer 108, as shown in FIG. 4E.

Figure 4F:
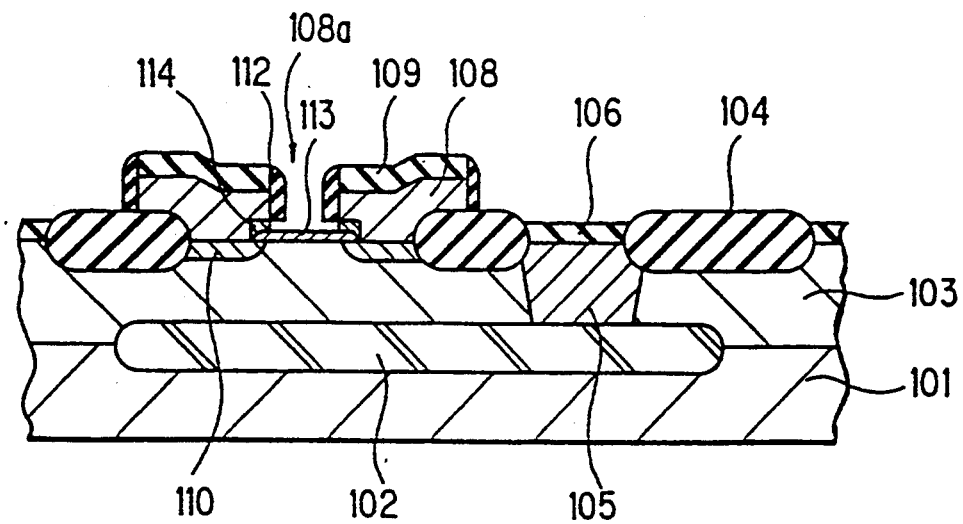

Sixth, the P-intrinsic epitaxial base layer 113 is selectively grown at a portion non-covered with insulation layer on the N− epitaxial layer 103 by molecular beam epitaxy (MBE) method. Simultaneously, the P-polycrystal silicon layer 114 is grown between the P-intrinsic epitaxial base layer 113 and the P+ polycrystal silicon layer 108, as shown in FIG. 4F. If polycrystal silicon and single crystal silicon have the same growing speed, single crystal silicon having a height of 50 nm and polycrystal silicon having a height of 50 nm are grown in the depression having a total height of 100 nm, so that the P-intrinsic epitaxial base layer 113 is electrically connected through the P-polycrystal silicon layer 114 to the P+ polycrystal silicon layer 108. Further, the P-intrinsic epitaxial base layer 113 is electrically connected through the P+ outer base region to the P+ polycrystal silicon layer 108.

Figure 4G:
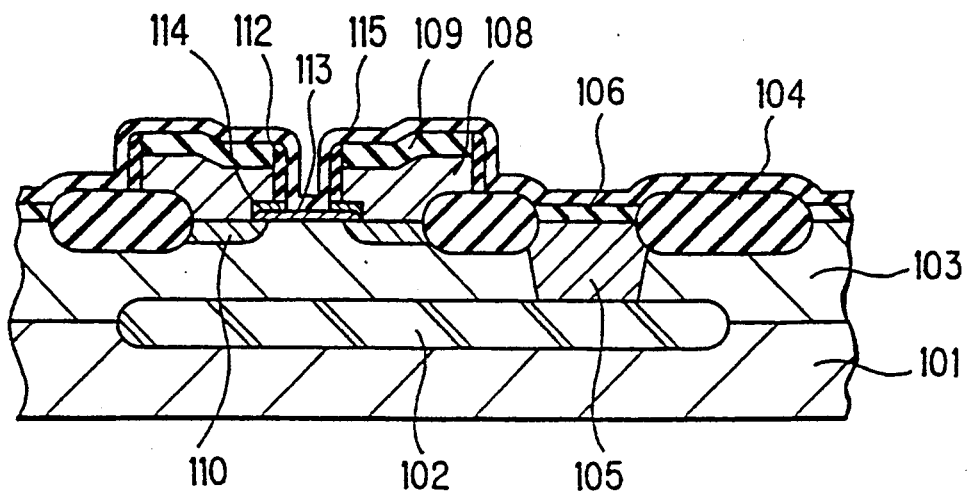

Seventh, the oxide layer 115 having a thickness of 100 to 200 nm is grown on the surface of the structure precedently processed as shown in FIG. 4G.

Figure 4H:
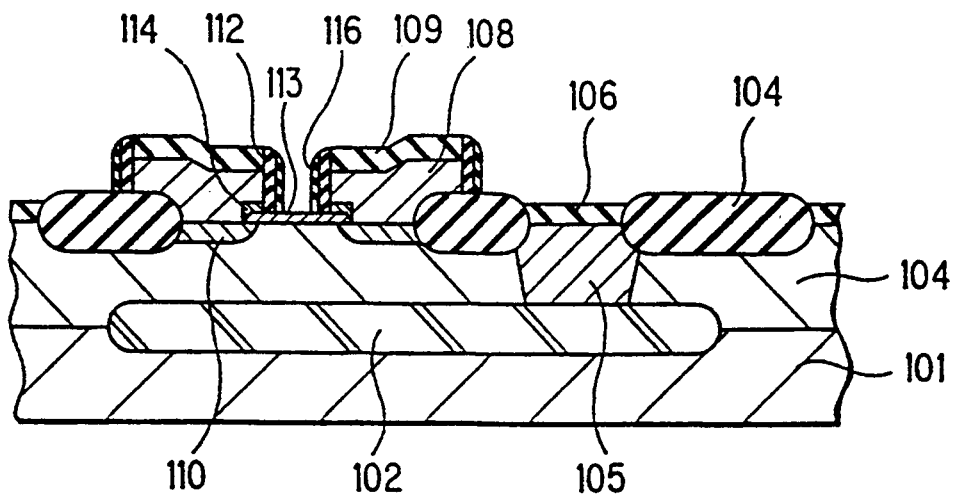

Eighth, the oxide layer 115 is etched by anisotropic dry etching to form the sidewall oxide layer 116 on the inner side surface of the aperture 108a covered with sidewall nitride layer 112 as shown in FIG. 4H.

Finally, polycrystal material doped with arsenic is powdered on the P-epitaxial base layer 113 to form the N+ polycrystal silicon layer 117 having a thickness of 150 to 300 nm. After that, the N+ emitter layer 118 is formed at the surface of the P-intrinsic base layer 113 by impurity growth from the N+ polycrystal silicon layer 117, the growing process being carried out by lamp annealing of 850° C. and 10 minutes. Thus, the self-aligned bipolar transistor of the first preferred embodiment is fabricated as shown in FIG. 3.

Figure 5:
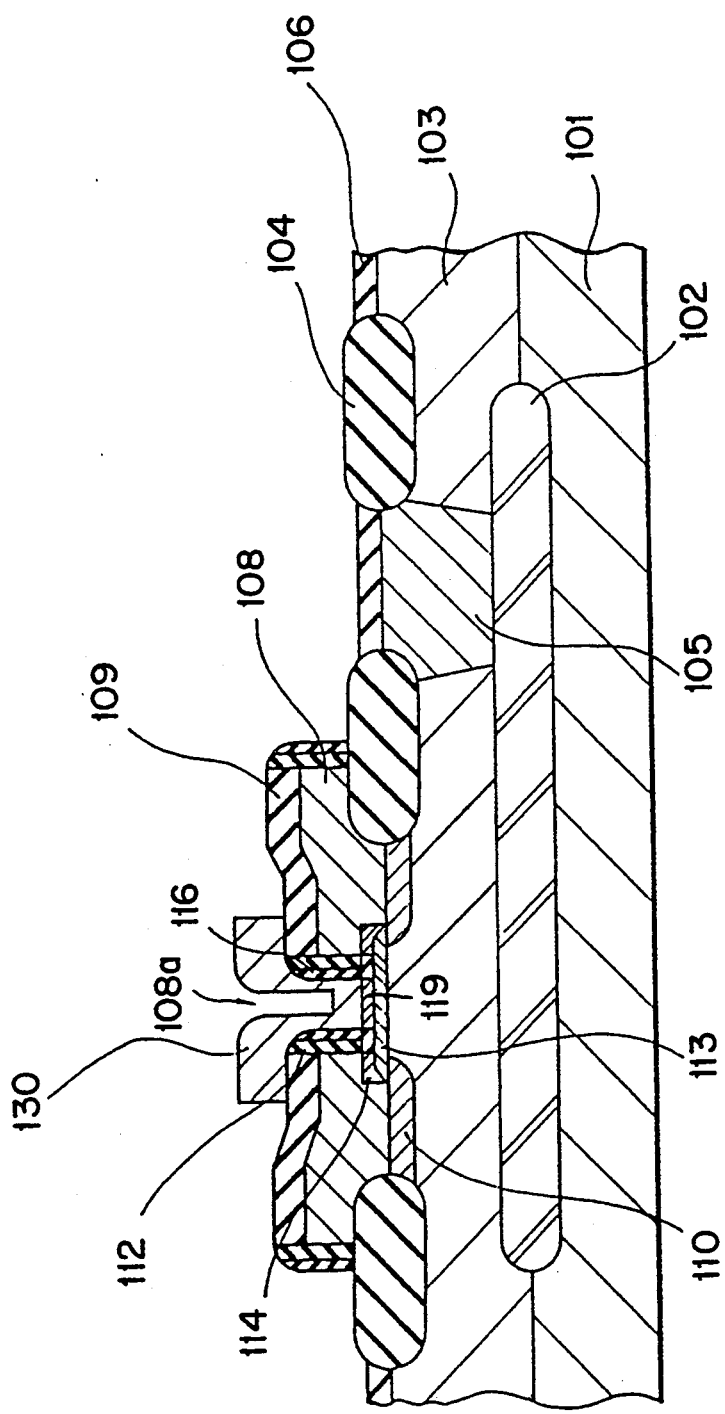
FIG. 5 is a cross-sectional view illustrating a semiconductor device of a second preferred embodiment according to the invention.

FIG. 5 shows a self-aligned bipolar transistor of a second preferred embodiment according to the invention. In this embodiment, an N+ emitter layer 119 is formed on a P-intrinsic epitaxial base layer 113 by molecular beam epitaxy (MBE) selective growing method. After that, a tungsten silicide layer 130, which is for an emitter electrode, is formed on the N+ emitter layer 119. According to the second preferred embodiment, thermal treatment is not necessary to form the emitter layer 119, so that a profile of the P-intrinsic epitaxial base layer 113 is not affected by the process.

Figure 6:
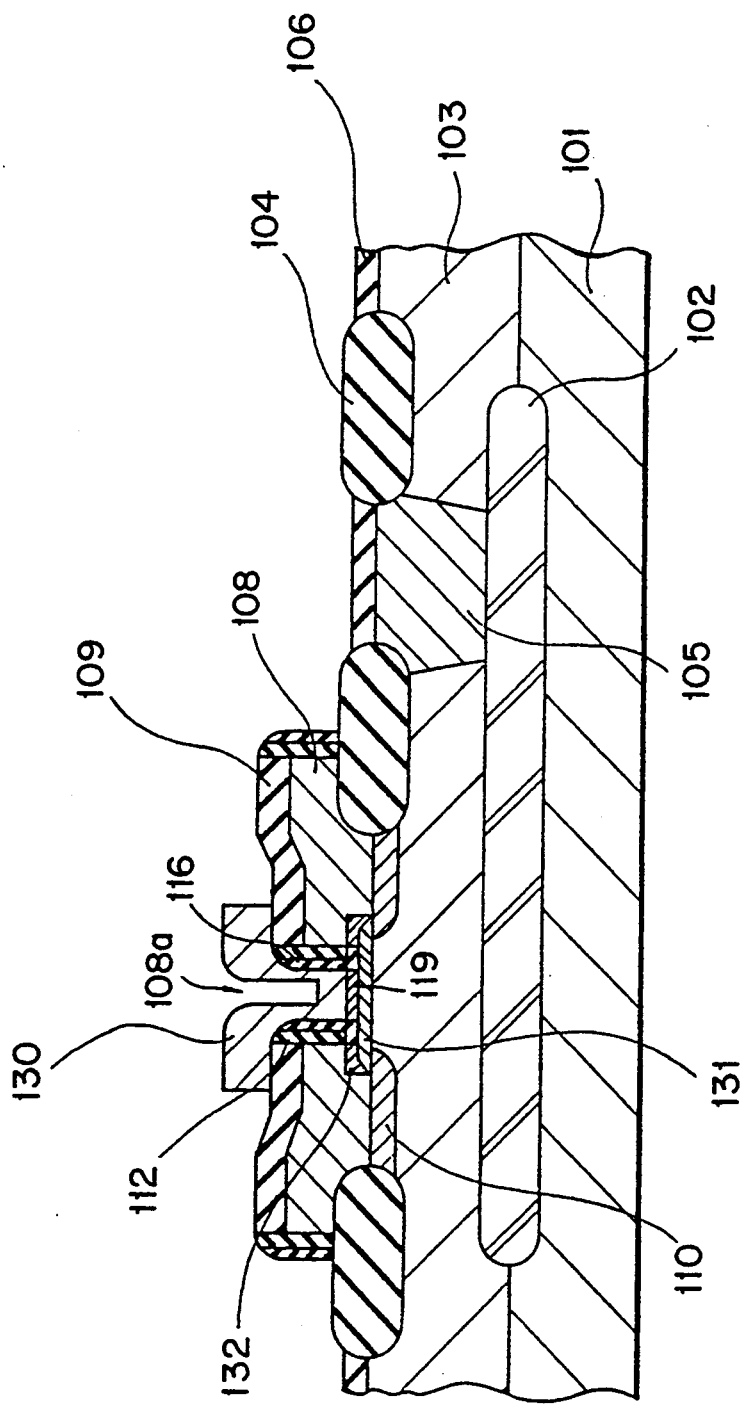
FIG. 6 is a cross-sectional view illustrating a semiconductor device of a third preferred embodiment according to the invention.

FIG. 6 shows a self-aligned bipolar transistor of a third preferred embodiment according to the invention. In this embodiment, a single crystal silicon-germanium alloy layer 131 is used for an intrinsic base layer. The intrinsic base layer 131 contains ten to thirty atomic mass percent germanium relative to total atomic mass. When the intrinsic base layer 131 is formed, a polycrystal silicon-germanium alloy layer 132 is also grown under an overhang portion of a P+ polycrystal silicon layer 108 to connect the intrinsic base layer 131 to the P+ polycrystal silicon layer 108.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A method for fabricating a semiconductor device, comprising the steps of:
   providing a silicon substrate of a first conductive type, on which a collector layer of a second conductive type which is opposite to the first conductive type is formed;
   forming an insulation layer on the collector layer at a portion where an intrinsic base layer will be formed;

forming a base electrode layer of the first conductive type on said collector layer;

forming an aperture on said base electrode layer by etching using said insulation layer as a stopper;

forming a sidewall insulation layer on an inner side surface of said aperture;

forming an outer base region of the first conductive type in said collector layer to connect said intrinsic base layer to said base electrode layer;

forming said intrinsic base layer of the first conductive type on said collector layer in said aperture;

forming an emitter electrode layer of the second conductive type in said aperture to be connected to said intrinsic base layer; and forming an emitter layer of the second conductive type in said aperture to be connected to said emitter electrode layer and to said intrinsic base layer, respectively.

2. A method for fabricating a semiconductor device, according to claim 1, wherein:
said outer base region forming step is performed by diffusing impurity from said base electrode layer into said collector layer.

3. A method for fabricating a semiconductor according to claim 1, wherein: device,
said intrinsic base layer forming step is performed by using molecular beam epitaxy (MBE) selective growing method.

4. A method for fabricating a semiconductor device, according to claim 1, wherein:
said emitter layer forming step is performed by diffusing of impurity from said emitter electrode layer into said intrinsic base layer.

5. A method for fabricating a semiconductor device, according to claim 1, wherein:
said emitter layer forming step is performed by using molecular beam epitaxy (MBE) selective growing method.

6. A method for fabricating a semiconductor device comprising the steps of:
forming an insulating film on a part of a collector region of a first conductivity type;

covering said insulating film and said collector region with a polycrystalline semiconductor layer containing impurities representative of a second conductivity type that is opposite to said first conductivity type;

selectively forming a first aperture in said polycrystalline semiconductor layer to expose a part of said insulating film;

removing said insulating film to form a second aperture in said polycrystalline semiconductor layer, said second aperture exposing said part of said collector region and being larger than said first aperture;

epitaxially growing a semiconductor layer from said part of said collector region and from said polycrystalline semiconductor layer to thereby form an intrinsic base region on said part of said collector region and an electrical connection region for electrically connecting said intrinsic base region to said polycrystalline semiconductor layer; and selectively forming an emitter region in said intrinsic base region.

7. The method as claimed in claim 6, further comprising the step of doping a part of said impurities from said polycrystalline semiconductor layer into said collector region to selectively form an outer base region in said collector region before the step of epitaxially growing, said intrinsic base region being thereby formed in contact with said outer base region.

* * * * *